(12) United States Patent
Raychowdhury et al.

(10) Patent No.: US 8,389,976 B2
(45) Date of Patent: Mar. 5, 2013

(54) METHODS OF FORMING CARBON NANOTUBE TRANSISTORS FOR HIGH SPEED CIRCUIT OPERATION AND STRUCTURES FORMED THEREBY

(75) Inventors: Arijit Raychowdhury, West Lafayette, IN (US); Ali Keshavarzi, Portland, OR (US); Juanita Kurtin, Hillsboro, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1223 days.

(21) Appl. No.: 11/648,209

(22) Filed: Dec. 29, 2006

(65) Prior Publication Data
US 2010/0252812 A1 Oct. 7, 2010

(51) Int. Cl.
*H01L 29/06* (2006.01)

(52) U.S. Cl. ............. 257/24; 257/E21.04; 257/E21.704; 257/E27.111; 257/E27.01; 438/151; 977/742

(58) Field of Classification Search ............... 257/24, 257/E21.704, E21.04, E27.111, E27.01; 438/151; 977/742
See application file for complete search history.

(56) References Cited

U.S. PATENT DOCUMENTS

| | | | |
|---|---|---|---|
| 2001/0022742 A1* | 9/2001 | Bhattacharyya | 365/171 |
| 2002/0004248 A1* | 1/2002 | Lee et al. | 438/3 |
| 2004/0036111 A1* | 2/2004 | Nishikawa et al. | 257/316 |
| 2005/0059219 A1* | 3/2005 | Tayanaka | 438/458 |
| 2005/0266605 A1* | 12/2005 | Kawakami | 438/99 |
| 2006/0157747 A1* | 7/2006 | Majumdar et al. | 257/288 |
| 2006/0172497 A1* | 8/2006 | Hareland et al. | 438/286 |
| 2007/0155065 A1* | 7/2007 | Borkar et al. | 438/149 |

* cited by examiner

*Primary Examiner* — Jami M Valentine
(74) *Attorney, Agent, or Firm* — Forefront IP Lawgroup, PLLC

(57) ABSTRACT

Methods and associated structures of forming a microelectronic device are described. Those methods may comprise forming a channel region on a substrate, wherein the channel region comprises at least one CNT, forming at least one source/drain region adjacent the channel region, and then forming a gate electrode on the channel region, wherein a width of the gate electrode comprises about 50 percent to about 90 percent of a width of the contact region.

17 Claims, 8 Drawing Sheets

METHODS OF FORMING CARBON NANOTUBE TRANSISTORS FOR HIGH SPEED CIRCUIT OPERATION AND STRUCTURES FORMED THEREBY

BACKGROUND OF THE INVENTION

Scaling of silicon technology continues while researchers investigate alternative novel materials for future technology generations beyond year 2015. Carbon nanotubes (CNTs) with their excellent carrier mobility are a potential candidate. CNT's have been evaluated for use as field effect transistors (FETs), and may have applications for fast switch devices. Optimization of architectural design and structural features will be necessary for providing the highest performing devices required for high performance circuit operation.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
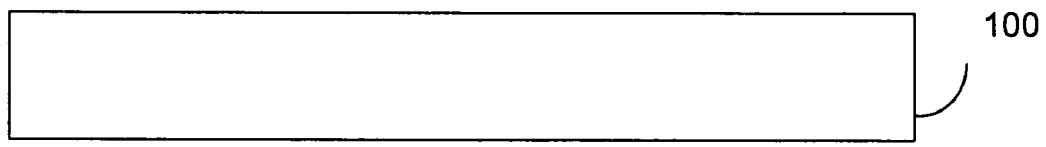
FIGS. 1a-1m represent structures according to an embodiment of the present invention.
Figure 1B:
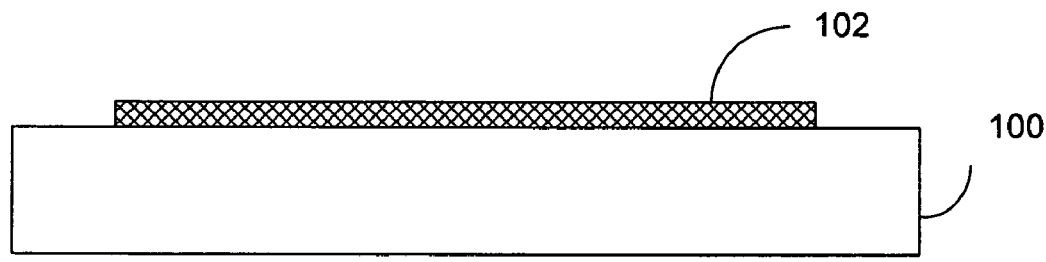

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may comprise forming a channel region on a substrate, wherein the channel region comprises at least one CNT, forming at least one source/drain region adjacent the channel region, and then forming a gate on the channel region, wherein a width of the gate comprises about 50 percent to about 90 percent of a width of the contact region. Methods of the present invention may enable the optimization of transistor architecture and structure, while providing high performing devices required for high performance circuit operation.

FIGS. 1a-1m illustrate an embodiment of a method of forming a microelectronic structure, such as a CNT FET structure, for example. FIG. 1a illustrates a cross-section of a portion of a substrate 100. The substrate 100 can be semiconducting or insulating. It can also be a flexible polymer or plastic type of substrate or it can be a hard material, such as but not limited to glass, for example. The substrate 100 may be comprised of materials such as, but not limited to, silicon, silicon-on-insulator, germanium, indium antimonide, lead telluride, indium arsenide, indium phosphate, gallium arsenide, gallium antimonide, or combinations thereof. In one embodiment, the substrate 100 may comprise silicon with a dielectric insulator on top that allows for back gate bias application and further control from back gate. In an embodiment, the substrate 100 may include devices that together form multiple microprocessor cores on a single die.

Figure 1C:
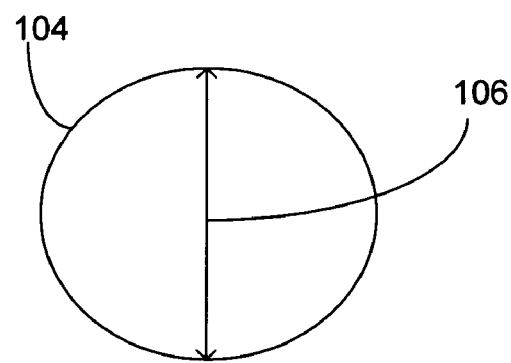

A channel region 102 (FIG. 1b) may be formed on the substrate 100, wherein the channel region 102 may comprise at least one CNT 104 (cross sectional view, FIG. 1c). In one embodiment, the at least one CNT 104 may be placed and/or formed on the substrate 100 using Langmuir-Blodgett or self-assembly-techniques, for example. In another embodiment, the at least one CNT 104 may be directly grown on the substrate 100 by utilizing a chemical vapor deposition (CVD) process, for example. The method of placement of the at least one CNT 104 on the substrate may vary depending upon the particular application. In some embodiments, the at least one CNT 104 may comprise at least one single walled CNT, and/or may comprise at least one semiconducting CNT.

Figure 1D:
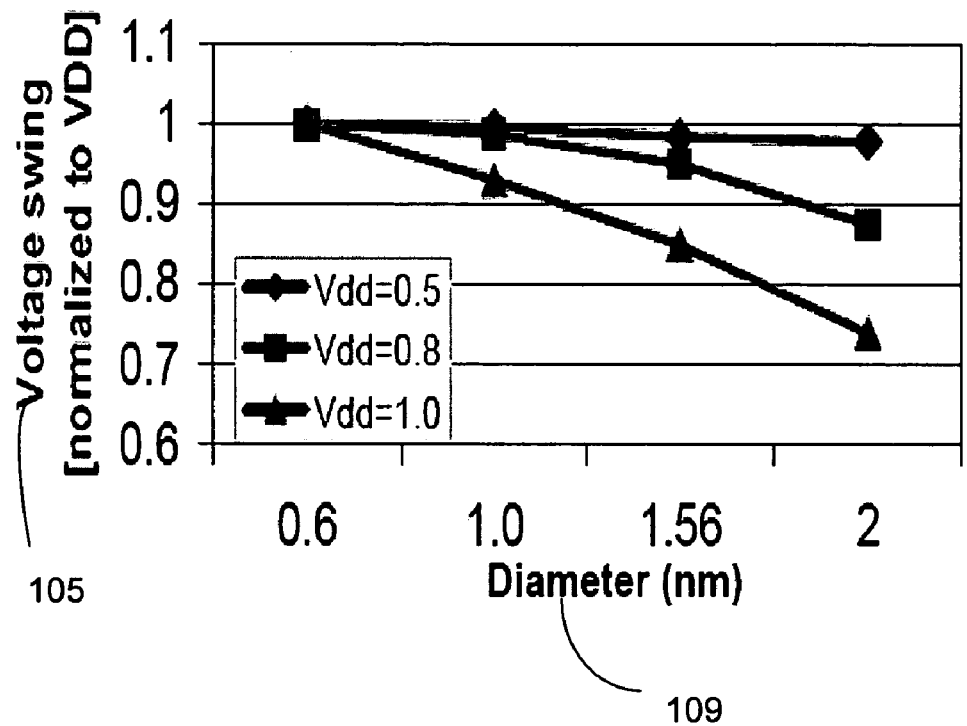

In one embodiment, the at least one CNT may comprise a diameter 106 of about 1 nm to about 1.5 nm. FIG. 1d depicts a graph of voltage swing normalized to Vdd 105 for various diameters of high performance, single tube CNT Field effect Transistors (CNT FET) 106. The graph shows that for FET's comprising CNT channel regions with CNT diameters from about 1 nm to about 1.6 nm, the normalized voltage swing of the device is from about 0.8 to about 1. This is an acceptable level for high speed digital applications.

Figure 1E:
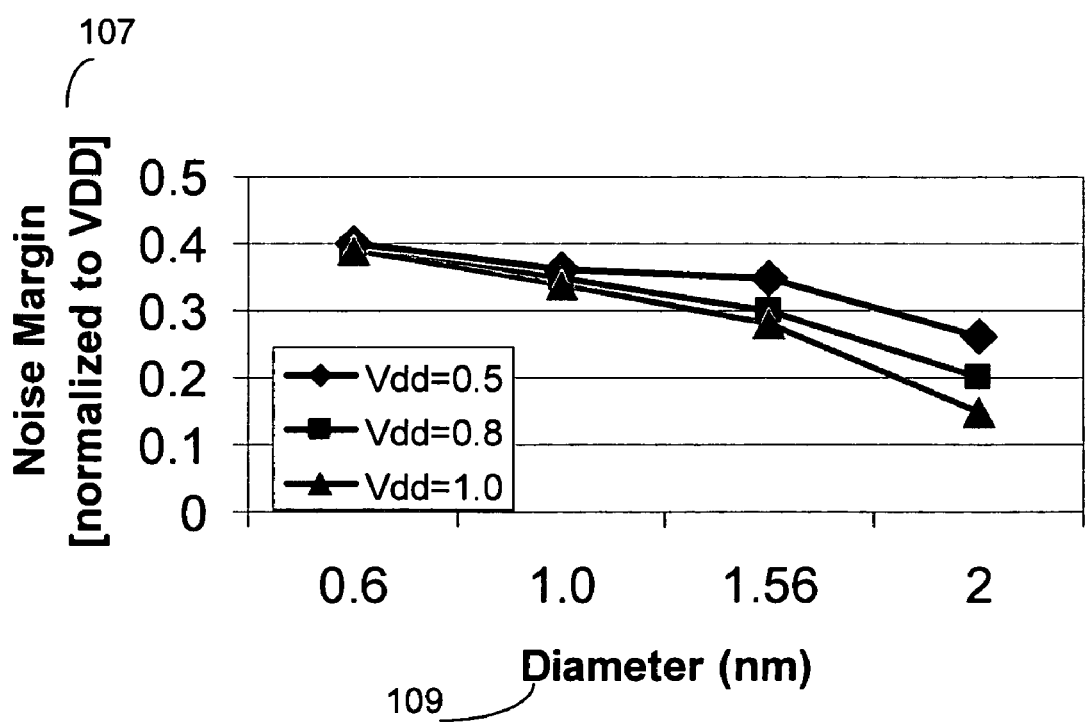
Figure 1F:
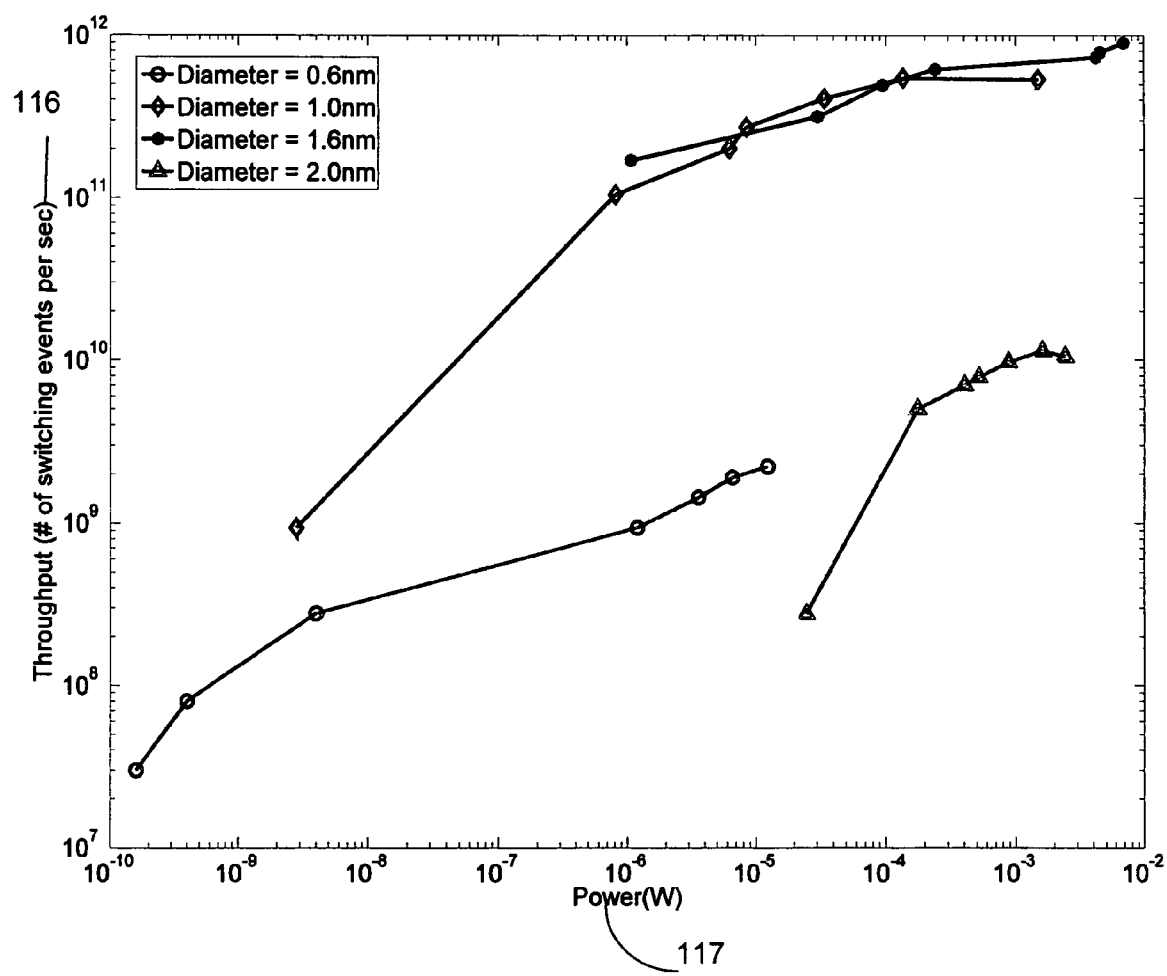

Since the band gap of a CNT is inversely proportional its diameter, a smaller diameter comprises a larger band gap. Digital applications typically require optimization of such parameters as power performance and noise margin, for a given supply voltage (0.1 to 0.8 v in each of the curves). High throughput and low power is desirable. Normalized noise margin 107, as can be seen in FIG. 1e, is still at an acceptable level for such high speed devices utilizing CNT diameters 106 of 1-1.6 nm, wherein the noise margin shows about a 10% degradation for a given supply voltage. FIG. 1f depicts a graph of throughput 116 (in terms of switching events per second) vs. power 117 for various CNT diameters as the circuit operating supply voltage is varied. It can be seen that the throughput is higher for CNT channel devices comprising a CNT diameter of about 1 nm to about 1.6 nm.

While smaller diameter CNT's may comprise larger bandgaps and exhibit lower leakage, they may also exhibit low performance in terms of throughput and I(on). Larger diameter CNT's may comprise smaller bandgaps and somewhat higher performance (I(on)) and throughput, but they typically exhibit higher leakage currents. Thus, in some embodiments, voltage swing, noise margin, power (and leakage) and throughput (and speed) may be optimized by utilizing CNT channels with diameters from about 1 nm to about 1.6 nm.

Figure 1G:
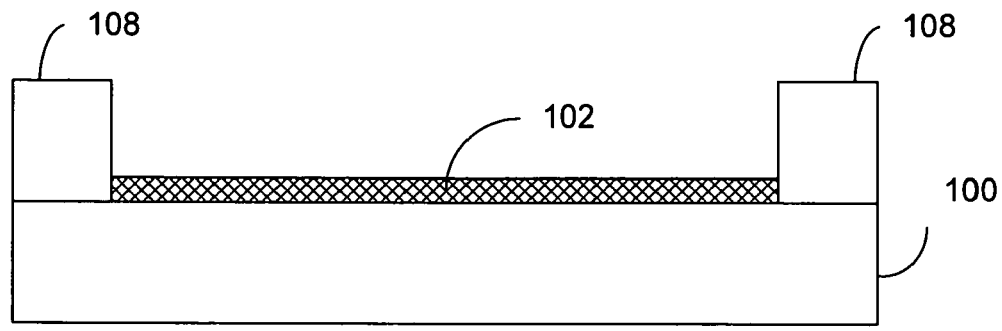

At least one source/drain region 108 may be formed adjacent the channel region 102 (FIG. 1g). The channel region 102 may be electrically coupled to the at least one source/drain pair 108. The at least one source/drain region 108 may be patterned using any suitable patterning technique, such as lithographic techniques, for example. Source/drain material can be metals forming Shottky barrier CNT FETs or doped seminducting to form MOSFET-type CNT FETs.

Figure 1H:
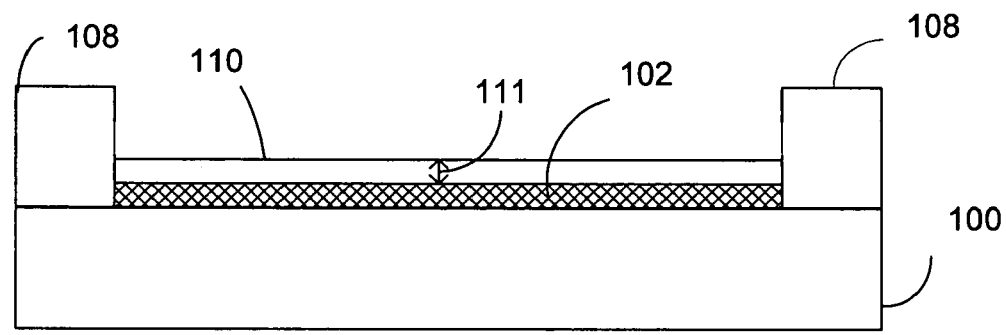

In one embodiment, a gate dielectric 110 may be formed on the channel region 102 (FIG. 1h). In one embodiment, the gate dielectric 110 may comprise a silicon dioxide layer and/or a high k gate dielectric material. In one embodiment, the high k material may comprise at least one of hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate and combinations thereof.

In one embodiment, the gate dielectric 110 may have a thickness 111 from about 10 Angstroms to about 50 Angstroms. In general, the thickness 111 of the gate dielectric 110 should be scaled for high performance. In one embodiment, hi-K dielectrics may be optimally utilized in CNT FET design. In one embodiment, the gate dielectric 110 may comprise a dielectric material comprising a dielectric constant greater than about 10.

Figure 1I:
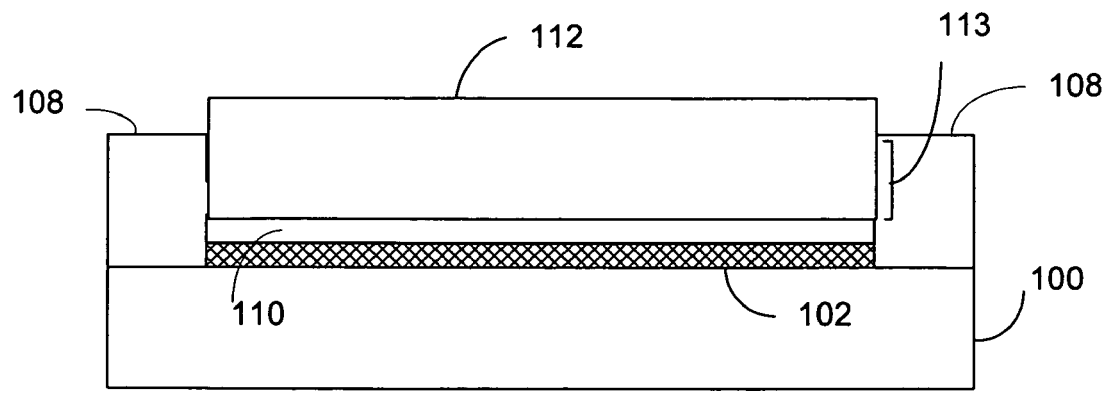

A gate electrode 112 may be formed on the gate dielectric 110 (FIG. 1i). In one embodiment, the gate electrode 112 may comprise at least one of aluminum, palladium, tungsten, platinum, ruthenium, molybdenum and niobium, and their alloys, metal carbides, metal nitrides, metal carbides and conductive metal oxides and combinations thereof. Shottky barrier CNT FETs work well with aluminum and palladium gate electrodes. The region wherein the at least one source/drain region 108 and the gate electrode 112 make contact with each other comprises a contact region 113. In one embodiment, a width 121 (see FIG. 1k for a top view of the width 121) of the contact region (i.e., the width of the contact region between the at least one source/drain and the gate) may comprise about 5 nm to about 20 nm.

Figure 1J:
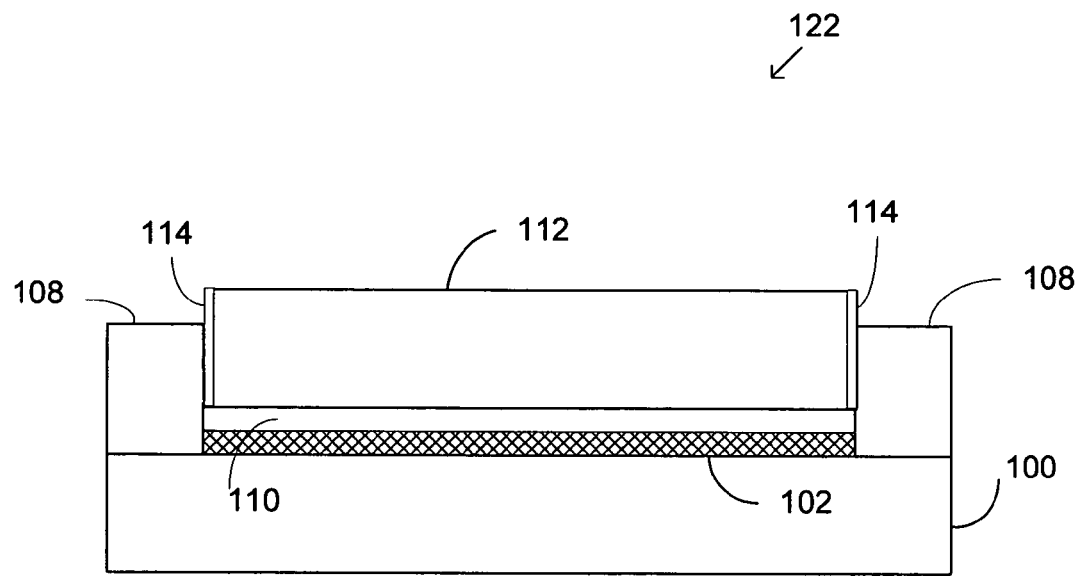

At least one spacer (insulating oxide) 114 may be formed adjacent the gate electrode 112 to form a CNT FET structure 122 (FIG. 1j). The at least one spacer 114 may comprise a dielectric material, and in some embodiments may comprise a thickness below about 20 angstroms. In one embodiment, the spacer material may comprise aluminum oxide, which naturally forms if the gate electrode material 112 is aluminum or other grown or deposited dielectrics such as SiO2, Si3N4 or other high-k dielectric material and combinations thereof.

In one embodiment, the CNT FET structure 122 may comprise a high speed digital CNT FET. In one embodiment, the voltage swing of the CNT FET structure 122 may comprise between about 0.8 and about 0.9 volts. In one embodiment, the throughput of a CNT FET 122 comprising multiple CNT channels can be between about $10^{10}$ to about $10^{12}$ switching events per second.

Figure 1K:
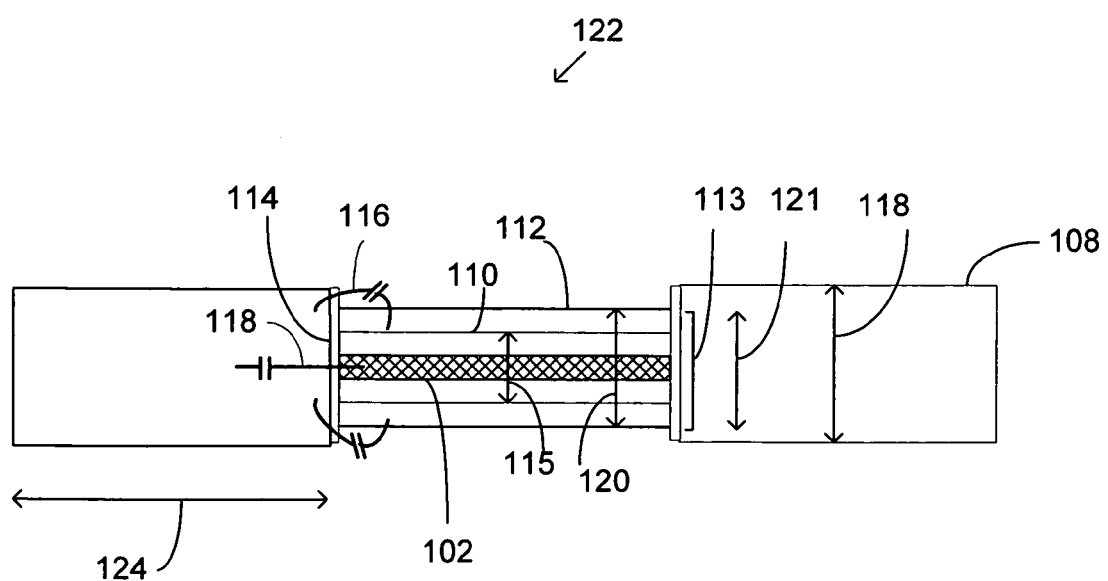

In some cases, parasitic capacitances may be present in various CNT FET designs, such as a fringe capacitance 116 (between gate electrode 112 and source/drain 108) and an overlap capacitance 118, for example (FIG. 1k, top view). FET performance may be limited by such parasitic capacitances, thus, minimization of these capacitances is desirable to maximize FET performance. Optimization of FET geometry may serve to reduce parasitic capacitance and therefore obtain the best performance from FET devices. Analysis further reveals that the contact resistance may not be a limiting factor as the effective $R_{ON}$ of single CNTs is high (about 10K $\Omega$). Consequently for contact resistance to contribute to performance degradation, its value should be comparable to the intrinsic CNT resistance. This resistance of about 10 KOhm is higher than the contribution of actual contacts unless the material interfaces are purely fabricated and engineered.

CNT devices are typically very small and may provide extremely high current densities. To utilize these currents, nano contacts to these small CNT FETs should be engineered very carefully. To reduce the effect of parasitic capacitances, device structure and self-aligned fabrication should be optimized at contact regions 113, for these promising transistors. In one embodiment, the overlap capacitance 118 and/or the fringe capacitance 116 may be reduced by providing a spacer 114 that is below about 20 angstroms in thickness. Choice of the insulator dielectric constant is also critical in minimizing the role of parasitic capacitance.

In another embodiment, parasitic capacitances may be reduced by optimizing a width 118 of the at least one source/drain 108 region. For example, the width 118 of the at least one source/drain 108 may be larger than a width 120 of the gate electrode 112. By decreasing the width 118 of the at least one source/drain 108, parasitic capacitance may be decreased. In one embodiment, the width 118 of the at least one source/drain 108 may comprise between about 4 to about 13 nm.

Figure 1L:
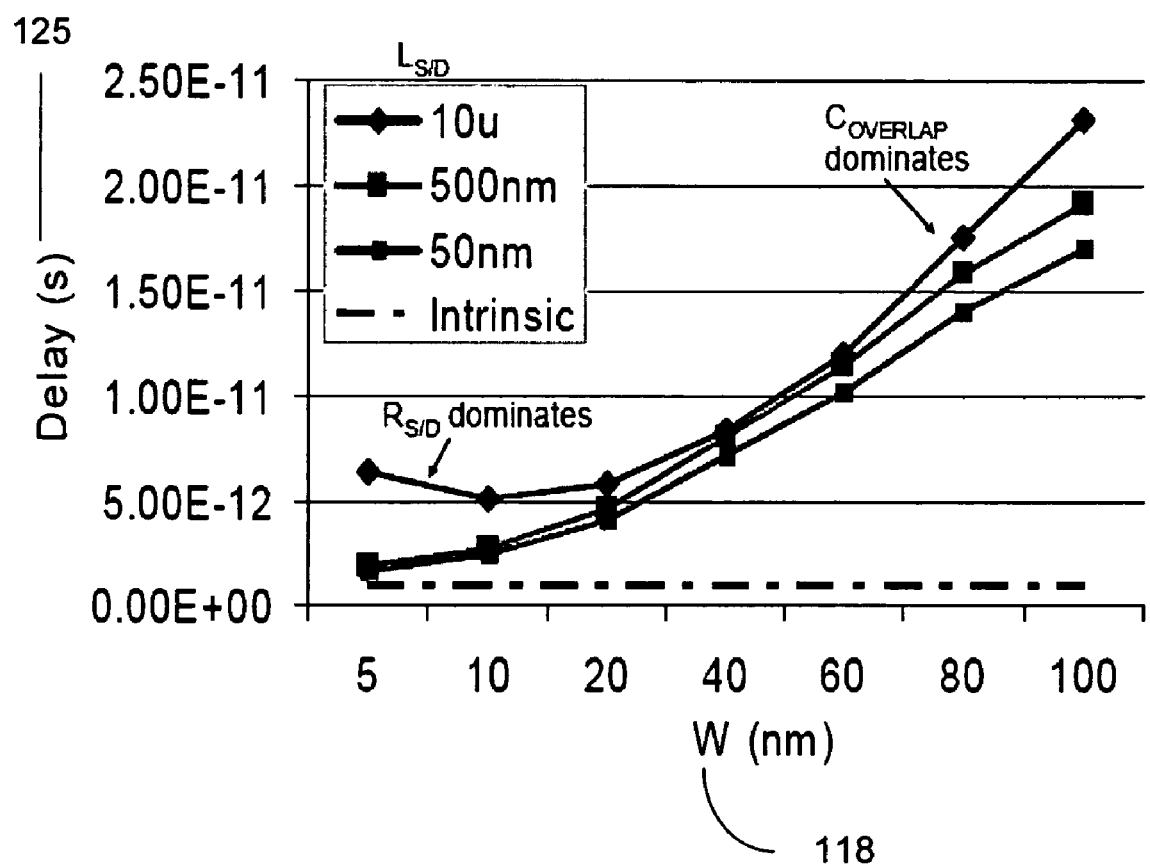

In another embodiment, a length 124 of the at least one source/drain 108 may be optimized to reduce parasitic capacitance. FIG. 1l depicts delay 125 in CNT FET devices with respect to the width 118 of the source/drain for various lengths of the source/drain 124. In some embodiments, the delay 125 may be reduced by employing a width 118 below about 10 nm and a length 124 below about 50 nm. In one embodiment, the at least one source/drain region 108 may comprises a width 118 of about 50 to about 200 angstroms, and a length 124 below about 500 angstroms. These are key parameters that should be considered for designing a quality nano contact to miniature CNT FETs.

By optimizing the geometry of the source/drain, the quality of the source/drain contact to the gate may be greatly improved. Utilizing smaller geometries for nano-contacts in CNT FET devices may decrease interface states between the source/drain contact region 113 and the CNT's of the channel region 120, thus improving the reliability and performance of such devices.

Figure 1M:
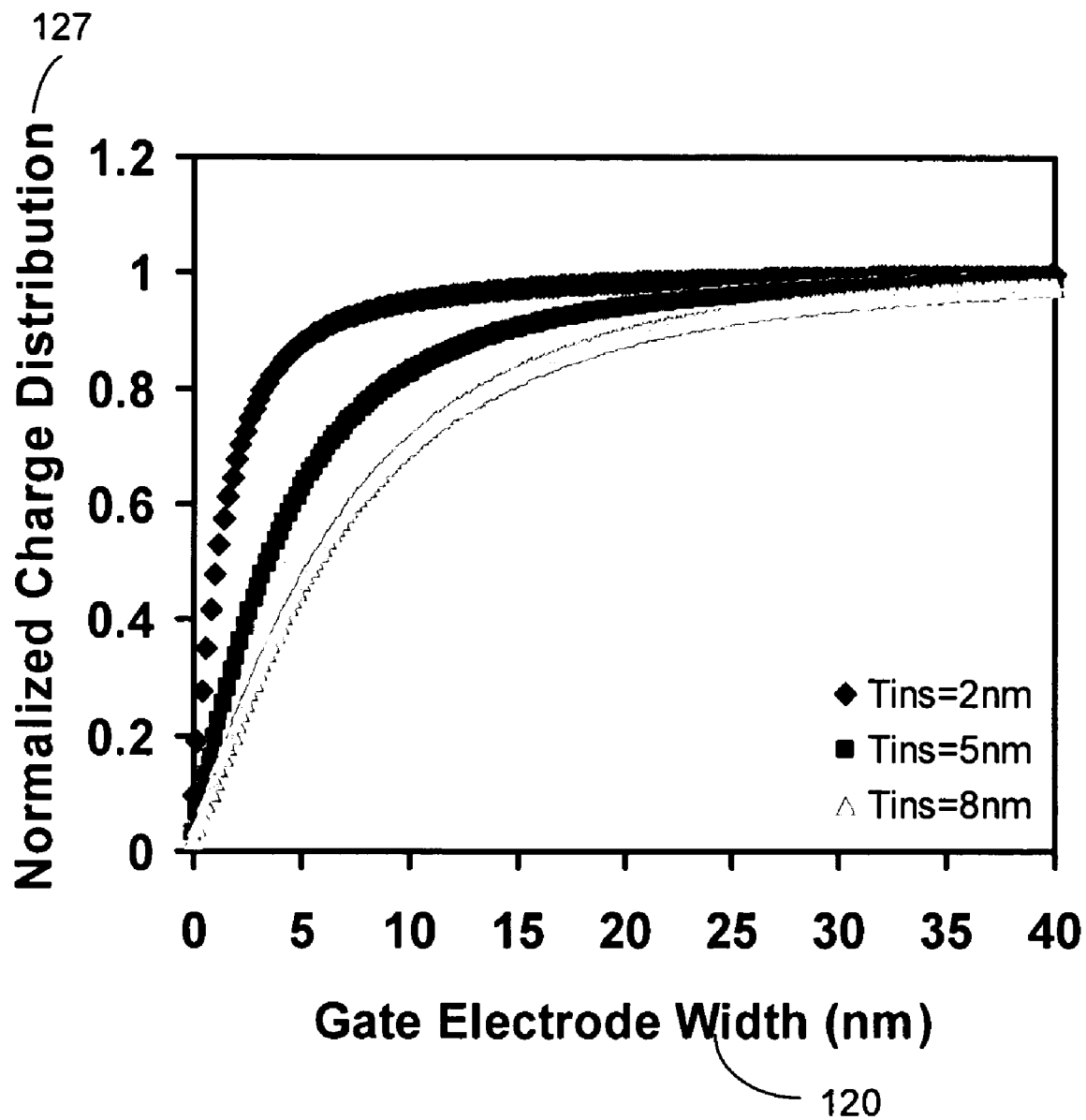

CNT FET devices may be further optimized by optimizing the geometry of the gate 112 structure. FIG. 1m shows that the width 120 of the gate electrode for a single CNT FET is optimized in terms of charge distribution 127 by utilizing a gate width 120 that is about 3 times the thickness 111 of the gate dielectric 110 (such as the gate dielectric in FIG. 1h, for example) used in the device. Wider gate electrodes may tend to increase fringe and other parasitic capacitances. Narrower gate electrodes may lose capacitance to the channel of the CNT FET thereby causing a loss of gate control (because the channel can only mirror a small part of the gate charge).

Thus, in one embodiment, desirable gate dimensions may comprise about 4-8 nm gate width 120, with the gate dielectric comprising about 1-3 nm in gate dielectric thickness 111. In the case of planar transistors, a simple overlap of the gate dielectric by the gate is sufficient, but when the channel region consists of nanotubes, the gate electrode needs to substantially be wider than the gate dielectric, in order to not lose capacitance. Due to the cylindrical nature of CNT's, the width 120 of gate electrode is critical in maximizing gate capacitance, and the performance of the CNT FET may be optimized by utilizing a gate width 120 that substantially overlaps a width 115 of the gate dielectric (referring back to FIG. 1k). In some cases the gate width 120 is larger than the diameter of CNTs 106.

In one embodiment, the performance of the CNT FET structure 122 may be further optimized by incorporating a gate width 120 that comprises about 50 percent to about 90 percent of the width 118 of the at least one source/drain region 108. In another embodiment, optimization of the CNT FET performance may be enhanced by incorporating a width 120 of the gate electrode 112 that may be between about 2.5 times to about 3.5 times a thickness 111 (for example, the gate dielectric of FIG. 1h) of the gate dielectric 110. In another embodiment, a width 118 of the gate electrode 112 may comprise about 50 angstroms to about 200 angstroms. In another embodiment, a width 118 of the gate electrode 112 may comprise about 3 times a width 115 of the gate dielectric 110.

Figure 2:
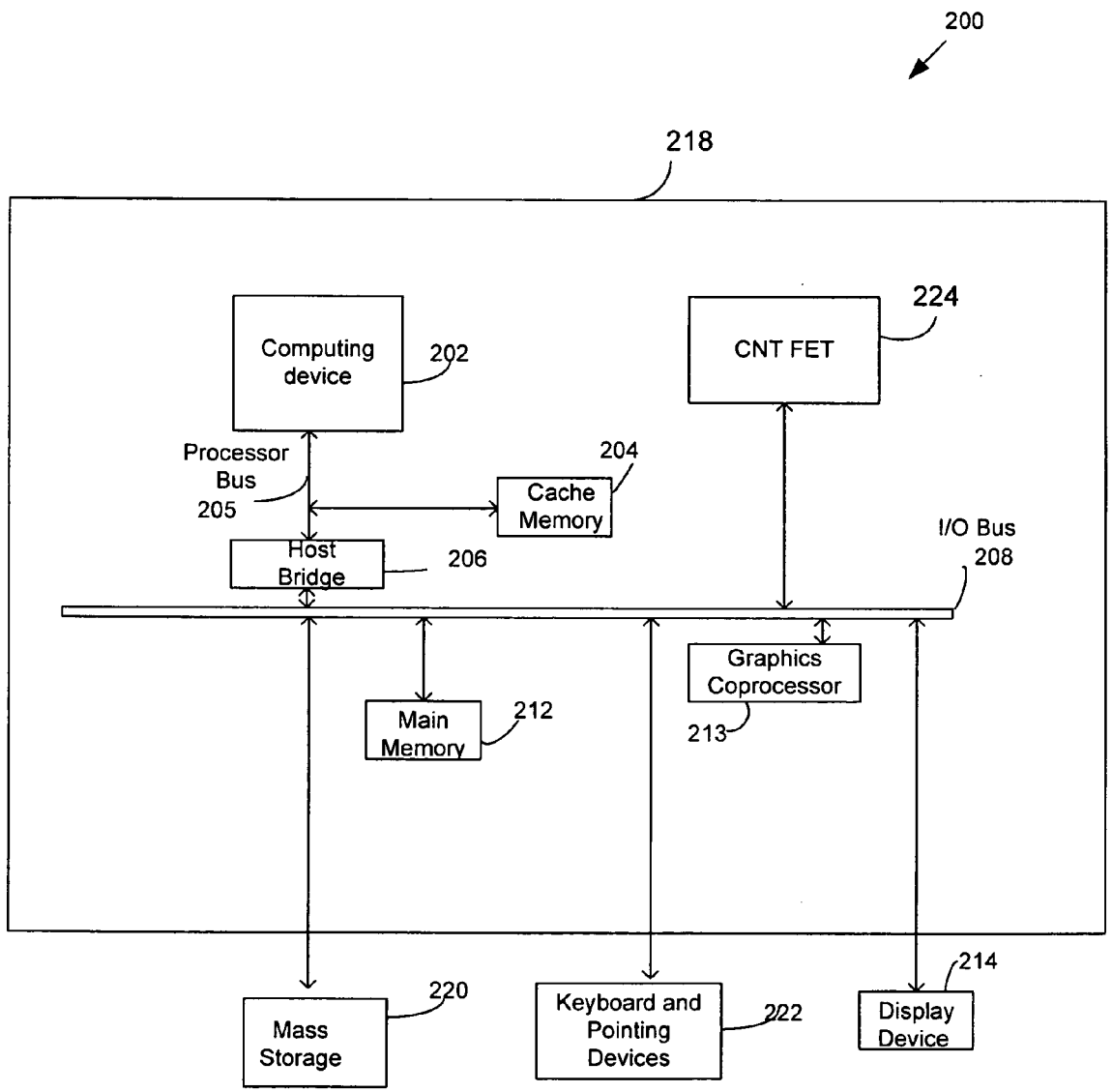
FIG. 2. represents a system according to an embodiment of the present invention.

FIG. 2 is a diagram illustrating an exemplary system 200 capable of being operated with methods for fabricating a microelectronic structure, such as the CNT FET structure of FIG. 1i, for example. It will be understood that the present embodiment is but one of many possible systems in which the CNT FET structures of the present invention may be used.

In the system 200, the CNT FET structure 224 may be communicatively coupled to a printed circuit board (PCB) 218 by way of an I/O bus 208. The communicative coupling of the CNT FET structure 224 may be established by physical means, such as through the use of a package and/or a socket connection to mount the CNT FET structure 224 to the PCB 218 (for example by the use of a chip package, interposer and/or a land grid array socket). The CNT structure FET 224 may also be communicatively coupled to the PCB 218 through various wireless means (for example, without the use of a physical connection to the PCB), as are well known in the art.

The system 200 may include a computing device 202, such as a processor, and a cache memory 204 communicatively coupled to each other through a processor bus 205. The processor bus 205 and the I/O bus 208 may be bridged by a host bridge 206. Communicatively coupled to the I/O bus 208 and also to the CNT FET structure 224 may be a main memory 212. Examples of the main memory 212 may include, but are not limited to, static random access memory (SRAM) and/or dynamic random access memory (DRAM), and/or some other state preserving mediums. The system 200 may also include a graphics coprocessor 213, however incorporation of the graphics coprocessor 213 into the system 200 is not necessary to the operation of the system 200. Coupled to the I/O bus 208 may also, for example, be a display device 214, a mass storage device 220, and keyboard and pointing devices 222.

These elements perform their conventional functions well known in the art. In particular, mass storage 220 may be used to provide long-term storage for the executable instructions for a method for forming CNT FET structures in accordance with embodiments of the present invention, whereas main memory 212 may be used to store on a shorter term basis the executable instructions of a method for forming CNT FET structures in accordance with embodiments of the present invention during execution by computing device 202. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 212 may supply the computing device 202 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a FET, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
    a channel region disposed adjacent at least one source/drain region, wherein the channel region comprises at least one CNT;
    a gate electrode disposed adjacent the at least one source/drain region, wherein a width of the gate electrode substantially overlaps a width of a gate dielectric disposed on the channel region; and
    a spacer disposed between the source/drain region and the gate electrode, wherein the spacer comprises a thickness below about 20 angstroms.

2. The structure of claim 1 wherein the width of the gate electrode comprises about 50 percent to about 90 percent of a width of the at least one source/drain region.

3. The structure of claim 1 wherein the width of the gate electrode is at least about 3 times wider than the width of the gate dielectric.

4. The structure of claim 2 wherein the width of the gate electrode is between about 2.5 times to about 3.5 times a thickness of the gate dielectric.

5. The structure of claim 2 wherein the gate electrode width comprises a thickness from about 50 angstroms to about 150 angstroms.

6. The structure of claim 1 wherein the gate dielectric comprises a thickness from about 10 angstroms to about 50 angstroms.

7. The structure of claim 2 wherein the at least one source/drain region comprises a width of about 50 to about 200 angstroms, and a length below about 500 angstroms.

8. The structure of claim 1 wherein the gate electrode comprises at least one of tungsten, platinum, ruthenium, palladium, molybdenum and niobium, and their alloys, metal carbides, metal nitrides, metal carbides and conductive metal oxides and combinations thereof.

9. The structure of claim 1 wherein a diameter of the at least one CNT comprises about 10 angstroms to about 15 angstroms.

10. The structure of claim 1 wherein the gate dielectric comprises a high k material.

11. The structure of claim 10 wherein the high k material comprises at least one of hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate and combinations thereof.

12. The structure of claim 1 wherein the structure comprises a CNT FET.

13. The structure of claim 12 wherein a throughput of a plurality of the CNT FET's comprises between about $10^{10}$ to about $10^{12}$.

14. The structure of claim 12 wherein the CNT FET comprises a high speed digital FET.

15. The structure of claim 12 further comprising a system comprising:
    the CNT FET;
    a bus communicatively coupled to the CNT FET; and
    a DRAM communicatively coupled to the bus.

16. The structure of claim 1 wherein the spacer comprises aluminum oxide.

17. The structure of claim 1 wherein the gate electrode comprises aluminum.

* * * * *